United States Patent
Tobashi et al.

(10) Patent No.: US 6,461,428 B2
(45) Date of Patent: Oct. 8, 2002

(54) METHOD AND APPARATUS FOR CONTROLLING RISE AND FALL OF TEMPERATURE IN SEMICONDUCTOR SUBSTRATES

(75) Inventors: Shyuji Tobashi, Shibata (JP); Tadashi Ohashi, Kudamatu (JP); Katsuyuki Iwata, Kudamatu (JP); Hiroyuki Saito, Shibata (JP); Shinichi Mitani, Numazu (JP); Takaaki Honda, Numazu (JP); Hideki Arai, Numazu (JP); Yoshitaka Murofushi, Mishima (JP); Kunihiko Suzuki, Shizuoka (JP); Hidenori Takahashi, Numazu (JP); Hideki Ito, Numazu (JP); Hirofumi Katsumata, Fuji (JP)

(73) Assignees: Toshiba Ceramics Co., Ltd., Tokyo (JP); Toshiba Kikai Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/729,669

(22) Filed: Dec. 5, 2000

(65) Prior Publication Data

US 2001/0020439 A1 Sep. 13, 2001

(30) Foreign Application Priority Data

Dec. 6, 1999 (JP) ............................................. 11-346186
Dec. 24, 1999 (JP) ............................................. 11-365912

(51) Int. Cl.⁷ .......................... C30B 25/14; C30B 25/16
(52) U.S. Cl. ............................. 117/98; 117/86; 117/89; 117/102; 117/107
(58) Field of Search ............................. 117/86, 89, 98, 117/102, 107

(56) References Cited

U.S. PATENT DOCUMENTS 5,873,781 A  * 2/1999 Keane .......................... 463/22
6,015,465 A  * 1/2000 Kholodenko et al. ........ 118/719

OTHER PUBLICATIONS

Shigeru et al., "Sheet Type Vapor Growth Device", Patent Abstracts of Japan No. 08–048595, (Feb. 20, 1996).

* cited by examiner

Primary Examiner—Felisa Hiteshew
(74) Attorney, Agent, or Firm—Foley & Lardner

(57) ABSTRACT

A method of controlling the temperature of a semiconductor substrate for prevention of any cracks from being formed in the semiconductor substrate event though semiconductors having different temperature rise/fall characteristics are fed into a reactor in which each semiconductor substrates is subjected to an oxidation, diffusion, or a chemical vapor deposition process. The temperatures are measured at various points in the semiconductor substrates in the heated reactor; the temperature rise/fall characteristic thereof is determined by computing the rate of temperature rise and the in-plane temperature distribution out of the measured values; a temperature control program adaptable for said temperature rise/fall characteristic is automatically selected out of a plurality of temperature control programs written in advance; the semiconductor substrate is controlled on the basis of the selected temperature control program. Also is provided a susceptor to reduce contamination of the semiconductor substrate with the metal impurities containing gas flow at the time of forming a thin film on the semiconductor substrate, and a gas phase thin film growth apparatus using such susceptor. The susceptor is formed with a gas flow deflector jutting downwardly from the peripheral portion of the reverse side of the susceptor to deflect the gas flow moving upon rotation along the reverse side of the susceptor from the center thereof to the peripheral portion thereof.

14 Claims, 8 Drawing Sheets

METHOD AND APPARATUS FOR CONTROLLING RISE AND FALL OF TEMPERATURE IN SEMICONDUCTOR SUBSTRATES

BACKGROUND OF INVENTION

The present invention relates to a method and an apparatus for controlling the rise and fall of the temperature in a semiconductor substrate including as a silicon wafer when such semiconductor substrate is being subjected to treatments such as oxidization, diffusion or chemical vapor deposition.

Further, the present invention relates to a susceptor in a gas phase thin film growth apparatus and a gas phase thin film growth apparatus using such susceptor and more particularly to a susceptor which is capable of minimizing contamination of the semiconductor substrate caused by metal impurities at the time of effecting an air phase growth of a thin film and an apparatus using such susceptor.

The semiconductor substrate has a wide range of temperature rise/fall characteristics depending on materials, thickness and physical properties and, in other words, differs in the rate of temperature rise/fall and the in-plane temperature distribution.

Particularly, silicon wafers have different temperature rise/fall characteristics depending on the concentration of dopants including boron, phosphor and antimony.

Conventionally, the control of rising and falling semiconductor temperature at the time of oxidation, diffusion and chemical vapor deposition is done by feeding semiconductor substrates into a reactor set at an actual operating temperature, measuring the temperature of said semiconductor substrates to obtain temperature rise/fall characteristics of the respective semiconductor substrates, and then, writing respective temperature control programs on the basis of the thus obtained data for the temperature rise and fall control and using only a reactor installed with a specific temperature control program which suits a semiconductor having a specific temperature rising/falling characteristic.

According to the conventional method of temperature rise/fall control of the semiconductor substrate, however, a problem that a semiconductor substrate is subjected to a temperature rise/fall control on the basis of a specific temperature control program suited to a semiconductor substrate having a specific temperature rise/fall characteristic. If a wrong semiconductor substrate having a different temperature rise/fall characteristic is fed into the reactor to be heated on the basis of said specific temperature control program, a heat stress is exerted to said semiconductor substrate with the result that cracks can be formed in the semiconductor substrate leading to troubles such as damage to the components of the reactor, breakdown of the reactor, or the like. Such troubles are likely to cause production inefficiency and cost increase.

Therefore, the first object of the present invention is to provide a method and an apparatus for controlling the rise and fall of a semiconductor substrate which is free from any cracks in the semiconductor substrate even though the a semiconductor substrate having a different temperature rise/fall characteristic is fed into the reactor and the temperature is cause to rise and fall on the basis of the program install to the reactor.

Further, the gas phase thin film growth apparatus in which a thin film is gas phase grown on the semiconductor substrate such as a silicon wafer or the like has a structure as shown in FIG. 12.

More specifically, the conventional gas phase thin film growth apparatus is composed of a cylindrical reactor 31, a susceptor 32 provided in the lower inner part of said reactor 31 for holding a semiconductor substrate W such as a silicon wafer or the like, rotary drive means including a rotary shaft 33 and a motor (not shown) for rotating said susceptor 32 and a heater 34 for heating the semiconductor substrate W supported by said susceptor 34. Further, there are a plurality of exhaust gas pipes 35 provided at the bottom of said reactor 31 to discharge a leftover reaction gas, said exhaust gas pipes 35 being connected to the exhaust gas control system (not shown).

On the other hand, the upper part of the reactor 31 is provided with a plurality of gas supply pipes 36 to allow a reaction gas such as a material gas for producing the thin film and a carrier gas therefor into the reactor 31 and a disc shaped inflow gas guiding plate 37. Said admitted gas guiding plate 37 has a number of holes 37a therein to guide the gas flow.

Further, said susceptor 32 is disc-shaped and formed of a material such as carbon, silicon carbide, quartz or the like, with the upper surface thereof being formed with a seat recess for holding said semiconductor substrate therein as disclosed in Japanese Patent Application (Kokai) Publication No. 8-48595.

Further, while having said inflow gas guide plate 37 provided in the upper part of the reactor 31 so as to prevent the semiconductor substrate W from being contaminated by impurities such as whiled-up metal particles by suppressing an inflow of the atmosphere gas, said conventional gas phase thin film growth apparatus also has a cylindrical gas guiding member 8 so as to surround the lower area of a reverse side peripheral portion of said susceptor 2.

Thus constructed, the susceptor 32 holding the wafer substrate W thereon is rotated at a predetermined revolution by a motor drive in said conventional gas phase thin film growth apparatus. At this time, the wafer substrate W is rotated and heated by the heater 34 to the predetermined temperature. Also at the same time, the reaction gases such as a material gas and a carrier gas therefore are allowed into said reactor 31 by way of a plurality of gas supply pipes 36. With the reaction gases passing through said plurality of holes 37a in the inflow gas guide plate 37, the gas flow rate distribution within the reactor 31 is made uniform. The thus uniformly distributed reaction gases are supplied onto the semiconductor substrate W held on the susceptor 32 to gas phase grow into a thin film.

In said gas phase thin film growth apparatus, the atmosphere gases (reaction gases) cause particles to be whirled up in turbulences, adherents on the inner wall of the reactor to be accumulated or the semiconductor substrate to be contaminated with metal impurities. Therefore, it is essential to see that such whirl up of the particles, accumulation of adherents on the inner wall of the reactor or contamination of the substrate is suppressed such that contamination of the semiconductor substrate from metal impurities is prevented for minimizing the formation of crystal flaw in the thin film formed on the semiconductor substrate.

For this purpose, said gas phase thin film growth apparatus is provided with the above mentioned inflow gas guide plate 37 in the upper part of the reactor and the cylindrical gas guiding member 38 to surround the lower area of the space around the susceptor.

As a result, the turbulence of the atmosphere gas (the reaction gas) in the upper and lower areas of the space beneath the susceptor 32 is suppressed, thus preventing the particles from whirling up and the semiconductor substrate from being contaminated by metal impurities.

In this connection, as shown in FIG. 13 and FIG. 14, the rotated susceptor causes a flow of the atmosphere gas flow (gas flow) to generate from the central area to the peripheral area of the susceptor 32 as shown in arrow on the reverse side of the susceptor 32. In this connection, it is noted that FIGS. 13 and 14 are fragmental sectional views of the peripheral area of the susceptor 32; FIG. 13 shows the gas deflector 38 is formed at the peripheral area of the susceptor 32 on the reverse side thereof whereas FIG. 14 shows the gas deflector 38 is formed over the entire reverse side of the susceptor 32.

The flow of said atmosphere gas (gas flow) is generated by the centrifugal force caused by the rotation of the susceptor 32 and the viscosity of the gas. Such gas flow is sucked from the lower peripheral area of the wall and from near the bottom of the reactor 31 to rise along the periphery of the rotary shaft 33 until flowing out from between the reverse side of said susceptor 32 and the upper part of the gas deflector 38.

Therefore, said gas flow comes into contact with the internal lower portion components of the reactor 31 and the motor or the like which rotates to drive the rotary shaft 33, resulting in the mingling of the particles and metal impurities with the gas flow.

Said gas flow rises along the peripheral area of the susceptor after coming out the susceptor reverse side. Further, said gas flow reaches the surface of the semiconductor substrate W to cause the semiconductor substrate W to be contaminated by said gas flow containing the metal impurities.

Due to high integration of semiconductors, a higher and higher quality is being required for semiconductor substrates. Given the situation, such contamination as observed in the formation of the thin film on the semiconductor substrate poses the problem of degradation of the quality of the semiconductor substrates at the production process thereof.

The present invention is made in order to solve the above discussed problems of the prior art. Therefore, the primary object of the invention is to provide a method of and apparatus for controlling the rise and fall of the temperature in a semiconductor substrate which will not cause cracks or the like to be formed in the semiconductor substrate even if a wrong semiconductor substrate having a different temperature rise/fall characteristics.

Further the second object of the invention is to provide a susceptor of the gas phase growth apparatus which is capable of reducing the contamination by an atmosphere gas containing particles and metal impurities from the reverse side of the susceptor for the semiconductor substrate at the time of forming a thin film on the semiconductor substrate.

Still further, the third object of the invention is to provide a gas phase thin film growth apparatus which is capable of producing a high quality semiconductor substrate therein by effectively using said susceptor.

SUMMARY OF THE INVENTION

In order to solve the above-mentioned problem and realize the first object of the invention, the method of controlling the rising and falling temperature in a semiconductor substrate essentially comprises, in one aspect of the invention, the steps of writing one or a plurality of temperature control programs in advance adaptable for a variety of semiconductor substrates having different temperature rise/fall characteristics in preparation for the case where the control of a rising and falling temperature in the semiconductor substrate is effected as needed while the semiconductor substrate is subjected to an oxidation, diffusion, or chemical vapor deposition process; measuring temperatures in a plurality of locations in said semiconductor substrate after a passage of a predetermined time period since the semiconductor substrate is fed into a reactor set a predetermined temperature to obtain measured values; computing a rate of temperature rise and a distribution range of in-plane temperatures thereof out of said measured values to determine a temperature rise/fall characteristics thereof; selecting a temperature control program adaptable for said determined temperature rise/fall characteristics out of said one or a plurality of temperature control programs written in advance; and controlling the rise and fall of said semiconductor substrate in accordance with said selected temperature control programs.

The method of controlling the rise and fall of the temperature comprises, in a second aspect of the invention, the steps of writing a variety of temperature control programs in advance adaptable for a variety of semiconductor substrates having different temperature rise/fall characteristics in preparation for the case where the control of a rising and falling temperature in the semiconductor substrate is effected as needed while the semiconductor substrate is subjected to an oxidation, diffusion, or chemical vapor deposition process; measuring infra-red absorption coefficients of semiconductor substrates before or after each semiconductor substrate is fed into a reactor set at a predetermined temperature to obtain a measured value; computing a rate of temperature rise and a distribution range of in-plane temperatures thereof to determine a temperature rise/fall characteristics thereof; automatically selecting a temperature control program adaptable for said determined temperature rise/fall characteristics out of said one or a plurality of temperature control programs written in advance; and controlling the rise and fall of said semiconductor substrate in accordance with said selected temperature control programs.

On the other hand, the apparatus of controlling the rise and fall of the temperature in a semiconductor substrate essentially comprises, in one aspect of the invention, a reactor in which a semiconductor substrate is subjected to an oxidation, diffusion, or a chemical vapor deposition process; a disc-shaped horizontal heater provided at a lower portion of said processing vessel; a susceptor rotatably provided above said heater to horizontally hold said semiconductor substrate thereon; at least three hoisting pins to horizontally support said semiconductor substrate when fed into said reactor and and semiconductor substrate on said susceptor; a plurality of thermometers provided at the upper portion of the reactor to measure the temperature of the semiconductor substrate; means for determining the rising and falling temperature characteristic by inputting values measured by said thermometers to compute the rate of temperature rise and the range of in-plane temperature distribution in a predetermined time period; and a heater output control means for controlling an output of said disc-shaped horizontal heater by storing a variety of temperature control programs written in advance in correspondence with a variety of semiconductor substrates having different rising and falling temperature characteristics, selecting a temperature control program adaptable for the temperature rising and falling characteristic determined by said means for the rising and falling temperature characteristics out of said variety of temperature control programs prepared in advance, and inputting the measured values for the substrate thermometers based on the selected temperature control program.

Further, the apparatus of controlling the rise and fall of the temperature in a semiconductor substrate essentially comprises, in second aspect of the invention, a reactor in which a semiconductor substrate is subjected to an oxidation, diffusion, or a chemical vapor deposition process; a disc-shaped horizontal heater provided at a lower portion of said processing vessel; a susceptor rotatably provided above said heater to horizontally hold said semiconductor substrate thereon; at least three hoisting pins to horizontally support said semiconductor substrate when fed into said reactor and semiconductor substrate on said susceptor; a plurality of thermometers provided at the upper portion of the reactor to measure the temperature of the semiconductor substrate; a cassette provided beside the reactor and loaded with a number of semiconductor substrates in a plurality of layers; a transfer unit to transfer said semiconductor substrates from said cassette to the upper portion of said processing vessel; infrared absorption coefficient meters provided along the transfer passage of said semiconductor substrates from the position of discharge thereof from the cassette to the position of loading thereof onto the hoisting pins; means for determining the rising and falling temperature characteristic by inputting values measured by said infrared absorption coefficient meter to presume the rate of temperature rise and the range of in-plane temperature distribution in a predetermined time period; and a heater output control means for controlling an output of said disc-shaped horizontal heater by storing a variety of temperature control programs prepared in advance in correspondence with a variety of semiconductor substrates having different rising and falling temperature characteristics, selecting a temperature control program adaptable for the temperature rising and falling characteristic determined by said means for the rising and falling temperature characteristics out of said variety of temperature control programs prepared in advance, and inputting the measured values for the substrate thermometers based on the selected temperature control program.

It is preferable that said thermometer is an infrared rays irradiating thermometer.

In the first method of controlling the rising and falling temperature in the semiconductor substrate and the apparatus therefor, the temperature rise/fall characteristic of the semiconductor substrate is determined after the feed thereof into the reactor, a temperature control program adaptable for the determined temperature rise/fall characteristic of the semiconductor substrate is selected out of one or a plurality of temperature control programs written in advance, and the heater output is controlled based thereon to cause the temperature to rise and fall.

Further, in the second method of controlling the rising and falling temperature in the semiconductor substrate and the apparatus therefor, a temperature rise/fall characteristic of the semiconductor substrate is deteremined upon or after the admittance thereof into the reactor, a temperature control program adaptable for the determined rise/fall characteristic of the semiconductor substrate is selected out of a variety of temperature control programs written in advance, and the heater output is controlled based thereon to cause the temperature to rise and fall.

In order to attain the second object of the present invention, the sesceptor of the gas phase thin film growth apparatus according to the present invention is placed on the upper surface of said susceptor rotatably within the gas phase thin film growth apparatus and the reverse side of said susceptor is formed at a peripheral portion thereof with a gas flow deflector jutting from the reverse side thereof such that an atmosphere gas flow moving at the time of the rotation of the susceptor from the center thereof to the peripheral portion thereof is deflected downwardly by said gas flow deflector.

In this way, the provision of said gas flow deflector e at the peripheral portion on the reverse side of the susceptor facilitates that an impurities containing atmosphere gas flow generated by the susceptor rotation to move from the central portion to the peripheral portion over the reverse side thereof is deflected downwardly at the peripheral portion of the reverse side of the susceptor.

As a result, said gas flow will not reach the surface of the semiconductor substrate, thus, assuring the production of a high quality thin film.

In this connection, it is preferable that said gas flow deflector is in the form of an annular wall jutting downwardly from the peripheral portion of the reverse side of the susceptor.

In this way, the provision of the annular wall jutting downwardly from the peripheral portion of the reverse side of the susceptor facilitates that the impurities containing atmosphere gas flow moving from the central portion to the peripheral portion over the reverse side thereof is deflected downwardly from the peripheral portion of the susceptor reverse side.

Further, it is preferable that the formation of the annular wall integral with the susceptor eliminates the need for assembling work thereof on the susceptor.

Further, it is preferable that the provision of the annular wall having a curved inner face or a slant face therein helps a smooth downward deflection of the gas flow, thus suppressing the turbulence of the gas flow which is otherwise likely to be produced at the time of deflection thereof.

The gas phase thin film growth apparatus according to the present invention comprises a reactor; a susceptor rotatably placed on the upper surface of the semiconductor within the reactor; a deflector jutting downwardly from the peripheral portion of the reverse side of the susceptor; rotary drive means for rotating said susceptor; heating means for heating the semiconductor substrate placed on the upper surface of the susceptor; means for charging into the reactor a reaction gas containing a material gas to form a thin film on the semiconductor substrate; and exhaust means for discharging a leftover reaction gas in the reactor such that said deflector in the susceptor is adapted to cause an atmosphere gas flow flowing from the center portion to the peripheral portion over the reverse side of susceptor at the time of rotation thereof to be deflected downwardly.

In this way, the provision of the deflector at the reverse peripheral portion of the susceptor causes an impurities containing atmosphere gas flowing from the central portion to the peripheral portion over the reverse side to be deflected downwardly from the reverse peripheral portion thereof.

As a result, said gas flow will not reach the surface of the semiconductor substrate placed on the upper face of the susceptor, thus assuring the formation of high quality thin films.

In this connection, it is preferable that there is provided a gas flow guide member below the underside of the susceptor, said gas flow guide member having an upper end in the proximity of said gas flow deflector of the susceptor.

In this way, the provision of the gas flow guide member such that said gas flow guide member surrounds an area below the susceptor is preferable, in view of preventing the impurities containing gas from reaching the surface of the semiconductor substrate and forming a high quality thin film on said semiconductor substrate.

Further, it is preferable that said deflector is an annular wall jutting downwardly from the reverse peripheral portion of the susceptor.

DESCRIPTION OF THE PREFFERED EMBODIMENTS

Hereinafter, embodiments of the present invention will be explained with reference to the accompanying drawings.

Figure 1:
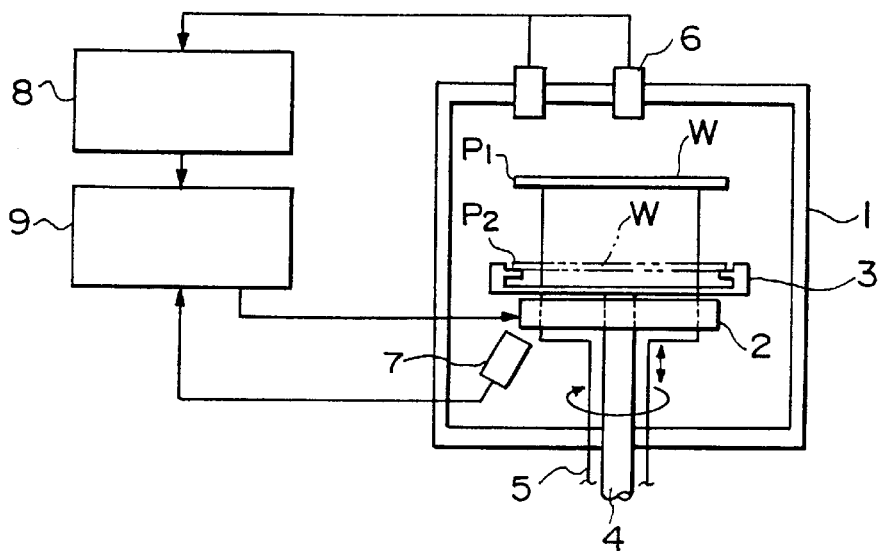
FIG. 1 is a general view of the first embodiment of the present invention relating to an apparatus for the gas phase thin film growth.

FIG. 1 is a general view of the first embodiment of the present invention relating to an apparatus for the gas phase thin film growth.

As shown in FIG. 1, there is provided a reactor 1 for subjecting a semiconductor substrate W such as a silicon wafer or the like to oxidation, diffusion, chemical vapor deposition (CVD) or the like and the interior thereof is normally kept air-tight such that an atmosphere gas or treatment gas is supplied thereinto or discharged therefrom.

The lower part of said reactor 1 is horizontally provided with a disc-shaped heater 2. Further, a susceptor 3 is provided immediately above said heater 2 to hold said semiconductor substrate W such that said susceptor 3 is rotatably supported by a rotary shaft 4 extending through said heater 2 and the bottom of said reactor 1.

Further, said heater 1 is provided with at least three hoisting pins 5 which are adapted to ascend and descend through the susceptor 3, the heater 2 and the floor of the reactor 1 in order to horizontally support the semiconductor substrate W fed into the reactor by a transfer unit (not shown) until said semiconductor substrate W reaches a position $P_1$ as depicted at an upper part of the inside of the reactor 1 where said semiconductor substrate W is horizontally supported.

Further, while said reactor 1 is provided with a plurality of infrared radiation thermometers 6 at the ceiling thereof to measure the temperatures at a plurality of points on the surface of the semiconductor substrate W, another infrared radiation thermometer 7 is provided at a lower part of the inside of the reactor 1 to measure the temperature of the reverse side of the semiconductor substrate W.

There are further provided with a temperature rise/fall characteristic determining means 8 which determines the temperature rise/fall characteristic by inputting signals representative of the temperature measured by said infrared radiation thermometers 6 and 7, computing the rate of temperature rise and the range of in-plane temperature distribution in a predetermined period of time out of said inputted signals; and heater output control means 9 which, on the one hand, stores one or a plurality of temperature control programs written in advance in correspondence with a plurality of semiconductor substrates having different temperature rise/fall characteristics and, on the other hand, selects a temperature control program adaptable for said temperature rise/fall characteristics determined from the inputted signals by said temperature rise/fall characteristics 8 out of said one or a plurality of temperature control programs such that the output of the heater 2 is controlled on the basis of said selected temperature control program while temperature values measured by said infrared radiation thermometers 6 and 7 are being inputted. In order to effect the control of the rising and falling temperature of various semiconductor substrates W by said apparatus, it is imperative first of all that the temperature rise/fall characteristics of various semiconductor substrates W (that is, the rate of temperature rise and the range of in-plane temperature distribution) are measured while one or a plurality of temperature control programs are written in advance and stored in the heater output means 9.

Next, the inside of the reactor 1 is replaced with an appropriate atmosphere gas and heated by the heater 2 up to an intermediate temperature between the room temperature and the maximum heating temperature of the semiconductor substrate W; for example at 520° C.

Figure 2:
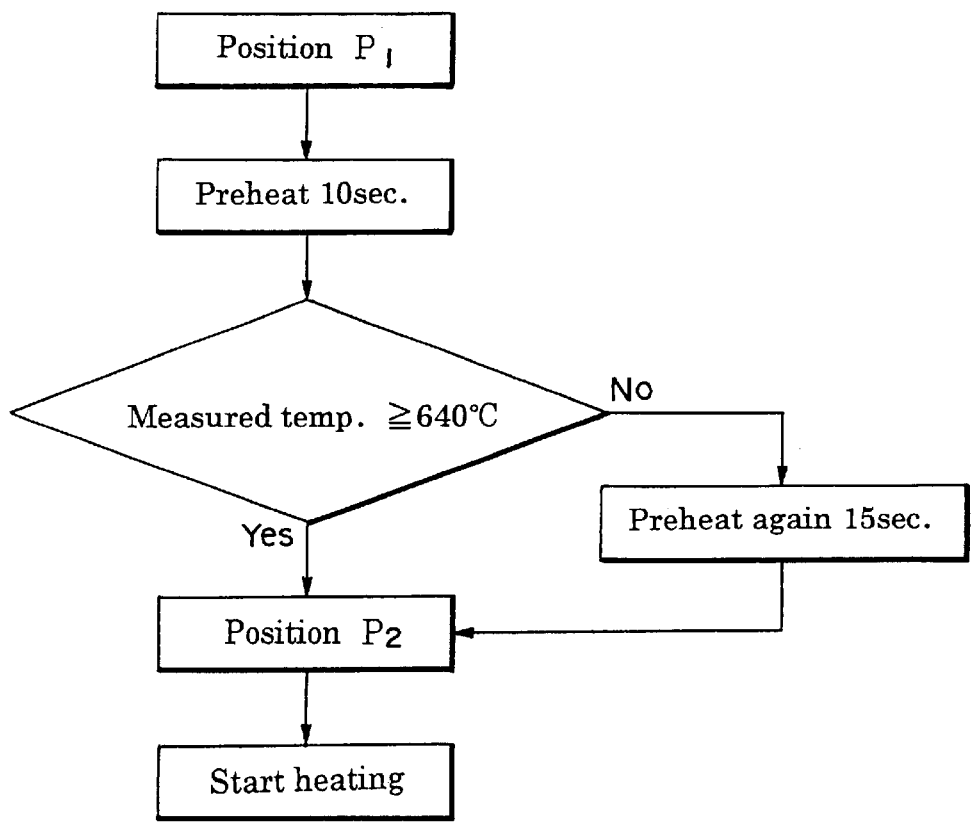
FIG. 2 is, a flow chart showing one example embodying the method of controlling the rising and falling temperature of the semiconductor substrate by use of the apparatus shown by FIG. 1.

Next, as shown in FIG. 2, while the semiconductor substrate W fed into the reactor 1 by a transfer unit is supported by the hoisting pins 5 at the position $P_1$ (as shown by a solid line in FIG. 1) and preheated for 10 seconds, a plurality of points on the semiconductor substrate W are subjected to temperature measurement by a plurality of infrared radiation thermometers 6 and 7. The signals of the thus measured values are inputted into the means 8 for determining temperature rise/fall characteristics such that the rate of temperature rise and the range of in-plate temperature distribution are subjected to computation to determine the temperature rise/fall characteristic of the semiconductor substrate before a signal representative of said determination is outputted to the heater output control means 9 together with a signal representative of the measured temperature of the semiconductor substrate W after a predetermined period of time.

Then, the control is done by the heater output means 9 as follows; that is, in case where the temperature of the semiconductor substrate W exceeds the predetermined temperature, for example, 640° C., the descent of the hoisting pins 5 brings the semiconductor substrate W to a position $P_2$ on the susceptor 3 (as shown in two-dotted chain lines in FIG. 1) before a temperature control program adaptable for the temperature rise/fall characteristic inputted from the temperature rise/fall characteristic determining means 8 is automatically selected out of said one or a plurality of temperature control programs stored in advance such that the output of the heater 2 is controlled on the basis of the thus selected temperature control program while the signal representative of the measured values of the infrared thermometers 6 and 7 are being inputted, thus controlling the rising and falling temperature of the semiconductor substrate W.

On the other hand, in case where the temperature of the semiconductor substrate W after a required period of time is less than the predetermined temperature, for example, 640° C., said semiconductor substrate W is held at said position $P_1$ for a required period of time, for example, for 15 seconds to be continuously preheated before a descent of the hoisting pins brings the semiconductor substrate W to the position $P_2$ on the susceptor 3. Thereafter, the temperature control program adaptable for the temperature rise/fall characteristic inputted from the temperature rise/fall characteristic determining means 8 is automatically selected out of said one or a plurality of temperature control programs written in advance. Then, the output of the heater 2 is controlled on the basis of the thus selected temperature control program while the signal representative of the values measured by the infrared radiation thermometers 6 and 7 is being inputted, thus controlling the rise and fall of temperature of the semiconductor substrate W.

Further, in order to control the rise and fall of the temperature of various semiconductor substrates W by means of the semiconductor substrate rising and falling temperature controlling apparatus having a structure as outlined in the foregoing, it is necessary not only to place the semiconductor substrate W at the position $P_1$ for a predetermined period of time for determination of the temperature rise/fall characteristic but also to write in advance a variety of temperature control programs adaptable for the respective temperature rise/fall characteristics and store such temperature control programs into the heater output control means 9 while the inside of the reactor 1 is replaced with an appropriate atmosphere gas to be held by the heater 2 at an intermediate temperature between the room temperature and the maximum heating temperature of the semiconductor substrate W, for example, at 550° C.

Figure 3:
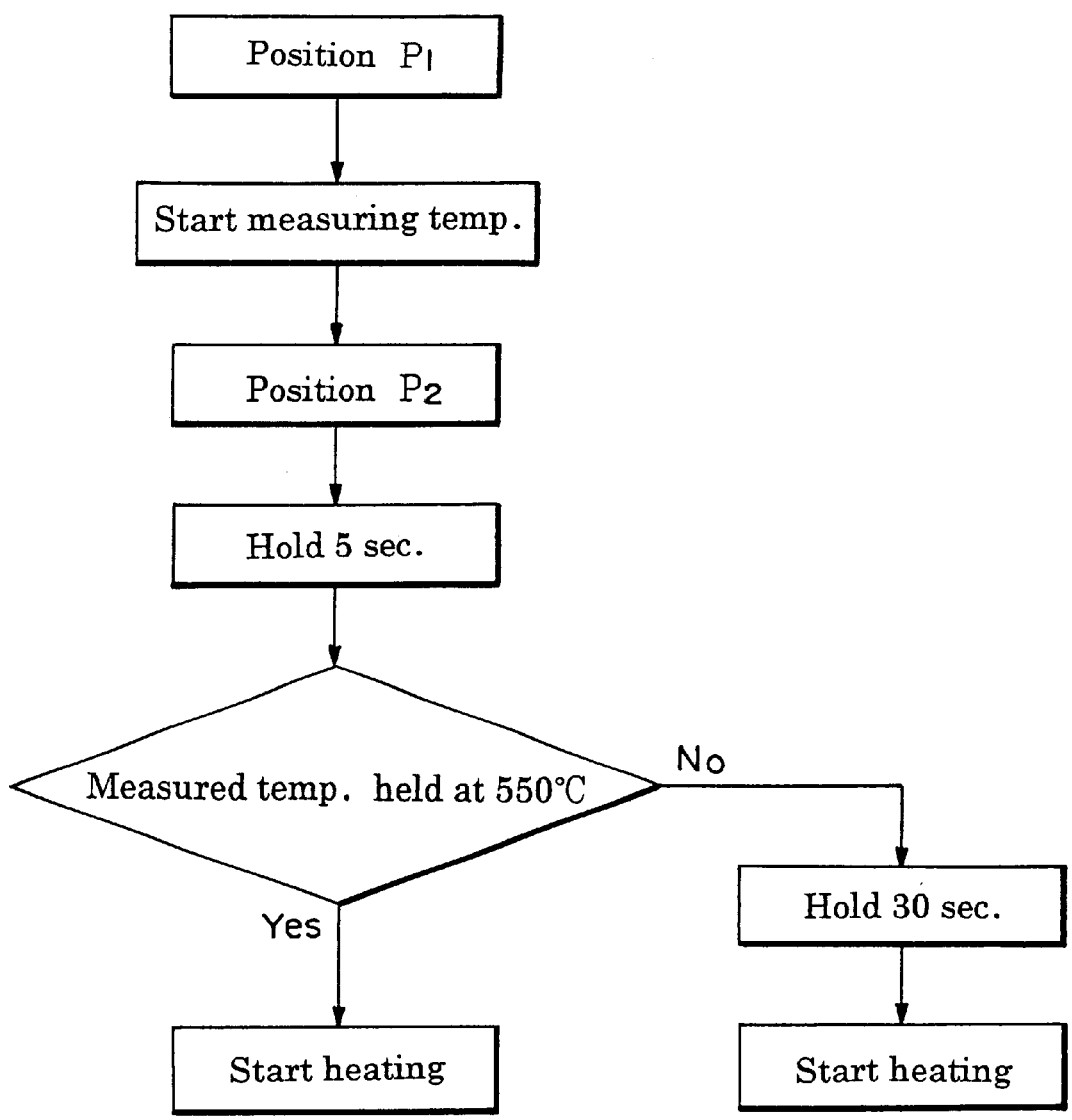
FIG. 3 is a flow chart showing another example embodying the method of controlling the rising and falling temperature of the semiconductor substrate by use of the apparatus shown by FIG. 1.

Next, as shown in FIG. 3, the semiconductor substrate W fed into the reactor 1 is supported by the hoisting pins 5, transferred from the position $P_1$ to the position $P_2$, where temperatures at a plurality of points on the semiconductor substrate W are measured by means of the infrared radiation thermometers 6 and 7 until a required period of time, for example, after 5 seconds. Then, the signals representative of the thus measured temperatures are inputted into the temperature rise/fall characteristic determining means 8 where the rate of temperature rise and the range of in-plane temperature distribution are computed to determine the temperature rise/fall characteristic. Thereafter, a signal representative of said determination is outputted to the heater output control means 9 together with the signals representative of the measured temperatures of the semiconductor substrate W after the required period of time.

Then, the heater output control means 9 operates such that in case where the temperature in the semiconductor substrate W reaches a predetermined intra-reactor temperature of, for example, 550° C., the temperature control program adaptable for the temperature rise/fall characteristic inputted from the temperature rise/fall characteristic determining means 8 is selected from the variety of stored temperature control programs written in advance before the output of the heater 2 is controlled on the basis of the thus selected temperature control program while the measured values of the infrared radiation thermometers 6 and 7 are being inputted thereinto such that the temperature of the semiconductor substrate W is controlled.

On the other hand, in case where the temperature in the semiconductor substrate W has not reached yet a predetermined intra-reactor temperature of, for example, 550° C., the substrate W is held at the position $P_2$ for a further period of time, for example, 30 seconds. Thereafter, the temperature control program adaptable for the temperature rise/fall characteristic inputted from the temperature rise/fall characteristic determination means 8 is automatically selected from the variety of temperature control programs stored in advance before the temperature of the semiconductor substrate W is controlled while inputting signals representative of the values measured by the infrared radiation thermometers 6 and 7.

In this connection, although the above embodiment has been explained with the infrared radiation thermometer 7 being provided, the invention is not limited thereto but may extend to a case wherein only the infrared radiation thermometer 6 is provided as such.

Figure 4:
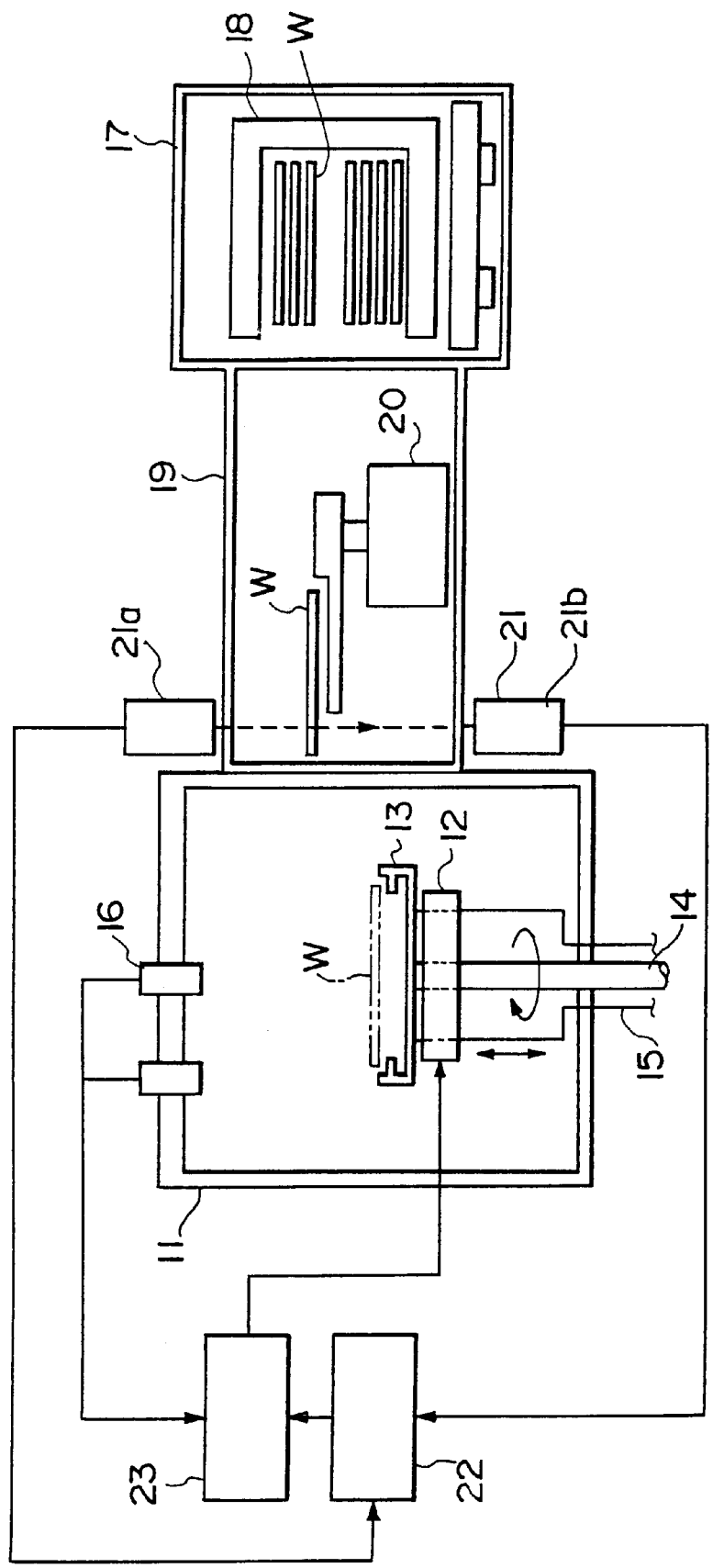
FIG. 4 is a general cross sectional view of the second embodiment of the present invention relating to an apparatus for the gas phase thin film growth.

FIG. 4 is a general cross sectional view of the second embodiment of the present invention relating to a temperature rise/fall characteristic apparatus.

In the figure, there is provided, as in the first embodiment, a reactor 11 for subjecting the semiconductor substrate such as a silicon wafer or the like to oxidation, diffusion, chemical vapor deposition (CVD) with the interior thereof being normally hermetically kept such that an atmosphere gas or the like is supplied thereinto and discharged therefrom.

While there is provided a disc-shaped heater 12 horizontally at the lower part of the reactor 11, a susceptor 13 is provided immediately above said heater 12 to horizontally hold a semiconductor substrate W, said susceptor being rotatably supported by a rotary shaft 14 extending through the heater 12 and the floor of the reactor 11.

Further, there is provided at least three hoisting pins 15 adapted to ascend and descend through the susceptor 13, the heater 12 and the floor of the reactor 11 to horizontally hold the semiconductor substrate W admitted into the upper part of the inside space of the reactor 11 and place the same on the susceptor 13.

Further, a plurality of infrared radiation thermometers 16 are provided in the upper part of the reactor 11 to measure temperatures at a plurality of points on the semiconductor substrate W.

On the other hand, there is provided a cassette chamber 17 on one side of the reactor 11 to accommodate a cassette 18 loaded with a number of semiconductor substrates in multiple layers.

Said cassette chamber 17 and said reactor 11 are connected to each other by a transport chamber 19, within which a transport unit 20 is provided to transport said semiconductor substrates W unloaded from said cassette 18 into the upper part of the reactor 11.

Further, there is provided an infrared absorption coefficient measuring system 21 for the semiconductor substrate W along said transport chamber 19 in the proximity of the reactor 11, said infrared coefficient measuring system 21 being arranged on both sides of the passage of substrate transport and composed of an infrared absorption coefficient meter 21a and an infrared rays sensor 21b to detect infrared rays penetrating said semiconductor substrate W.

There is further provided temperature rise/fall characteristic determining means 22 which is inputted with measured values from said infrared absorption coefficient meter 21, is adapted to compute the rate of temperature rise and the range of in-plate temperature distribution in the semiconductor substrate W, to determine temperature rise/fall characteristics thereof and to output signals representative of the determined characteristics to heater output control means, which will be explained later.

Figure 5:
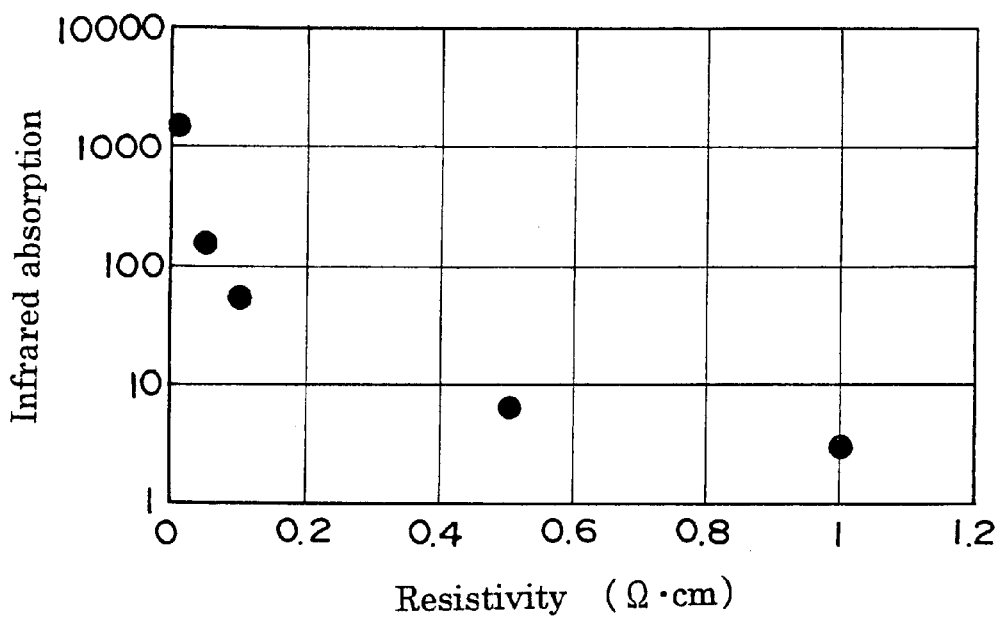
FIG. 5 is a graph showing the relationship of the rate of resistance and the infrared absorption coefficient.

In this connection, it is to be noted that there is a function as shown in FIG. 5 between the infrared absorption coefficient and the resistivity of the semiconductor W (the resistivity is in inverse proportion to the dopant concentration) with the result that the less the resistivity is, the more the infrared rays absorption coefficient is.

Figure 6:
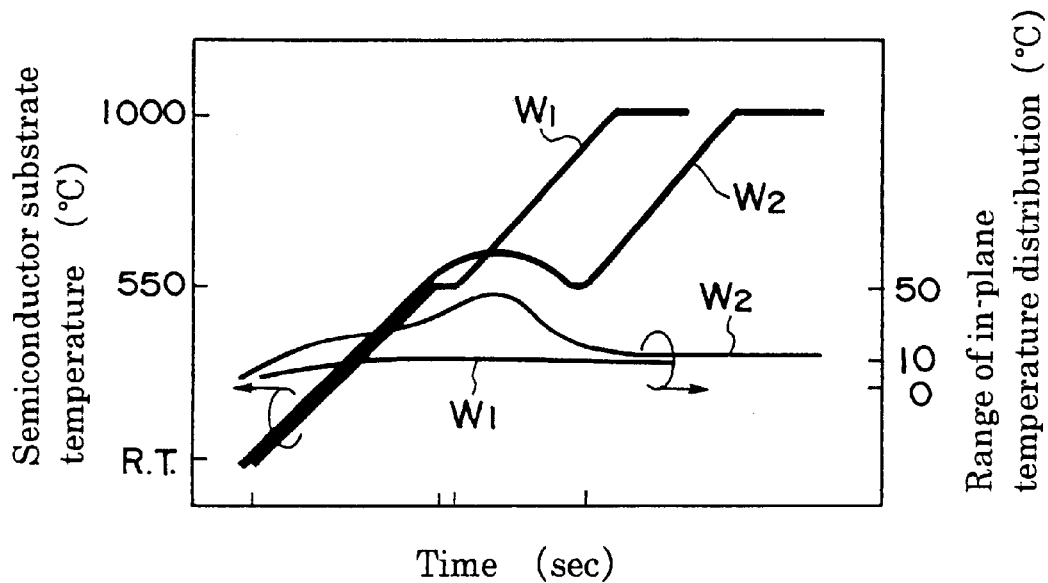
FIG. 6 is another graph showing the semiconductor substrate temperature and the in-plane temperature distribution thereof in relationship with a passage of time when a substrate having a large infrared absorption coefficient and another substrate having a small infrared absorption coefficient are being heated.

On the other hand, a semiconductor substrate $W_1$ having a large infrared absorption coefficient (such as a boron-heavy dope silicon wafer (with a resistivity of up to 0.015 $\Omega$/cm), and an oxide film backed boron-heavy dope silicon wafer(with a resistivity of up to 0.015 $\Omega$/cm)) and a semiconductor substrate $W_2$ having a small infrared absorption coefficient (such as boron-light dope silicon wafer (with a resistivity of up to 0.015 $\Omega$/cm) ) are fed into the reactor to be subjected to a temperature measurement by means of the infrared radiation thermometer. As shown in FIG. 6, while it was observed with the former (substrate $W_1$) that a temperature rise due to infrared absorption immediately starts and stays at a predetermined level with a small in-plane temperature distribution, it was observed with the latter (substrate $W_2$) that the infrared rays are so hard to be absorbed that the temperature rise is gentle with the result that after apparently exceeding a hold level, the temperature resumes to stay at the hold level while the range of apparent in-plane temperature distribution becomes wide (because the infrared rays penetrating the semiconductor substrate are detected by the infrared radiation thermometer). In this way, it is observed that the temperature rise/fall characteristics of the both substrates are related to the infrared rays absorption coefficient.

Therefore, it is possible to determine the temperature rise/fall characteristics of semiconductor substrates by computing the rate of temperature rise and the range of in-plane temperature distribution thereof.

There is further provided heater output control means 23 which stores a variety of temperature control programs written in advance in correspondence with a variety of semiconductor substrates, selects a temperature control program adaptable for the temperature rise/fall characteristic determined by inputting a signal representative of the determination of said temperature rise/fall characteristic determination means 22 out of said temperature control programs written in advance, and controls the output of the heater 12 on the basis of the selected temperature control program by inputting a signal representative of the value measured by the infrared thermometer 16.

In order to control the rising and falling temperature of various semiconductor substrates W by means of the thus constructed apparatus for controlling the temperature rise/fall in the semiconductor substrate, it is required first of all that the temperature rise/fall characteristic (that is, the rate of temperature rise and the range of in-plane temperature distribution in a predetermined period of time) is determined. At the same time, a variety of temperature control programs adaptable for respective temperature rise/fall characteristics are written in advance, and said temperature control programs are stored in the heater output means 23.

Next, the inside of the reactor 11 is replaced with an appropriate atmosphere gas and the temperature thereof is kept at a level between the room temperature and the highest heating temperature of the semiconductor substrate S, for example, at the level of 600° C.

Figure 7:
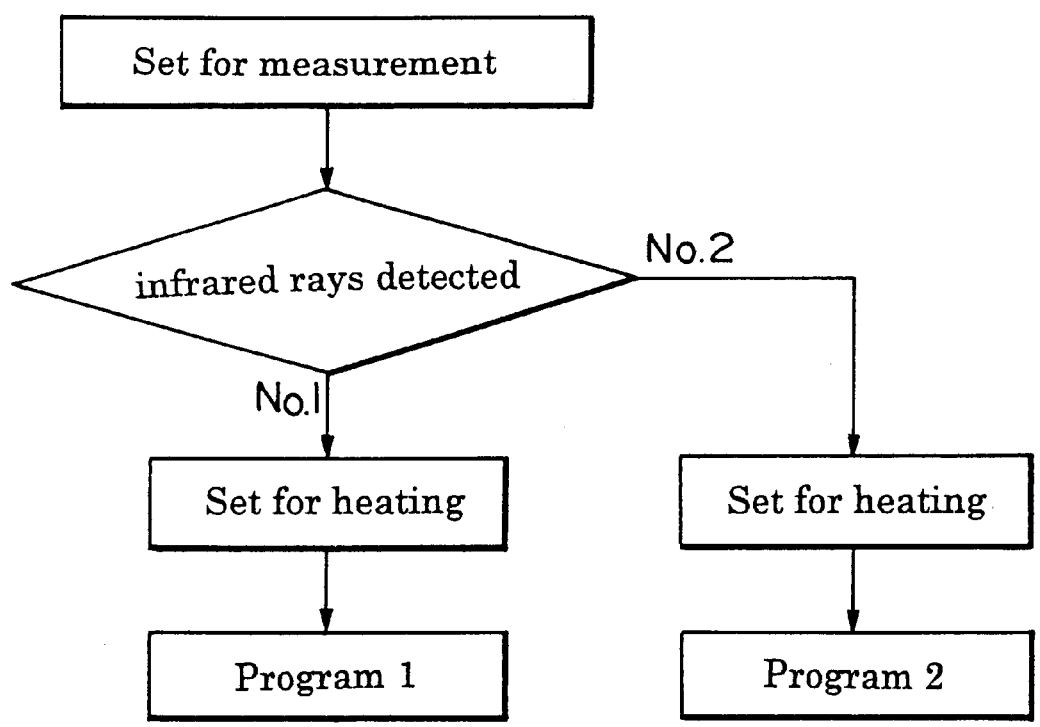
FIG. 7 is a flow chart showing a further example embodying the method of controlling the rising and falling temperature of the semiconductor substrates by use of the apparatus shown in FIG. 4.

Then, the semiconductor substrate W is transported by the transport means from the cassette 18 and, as shown in FIG. 7, on the way to the reactor 11, the infrared absorption coefficient meter 21 measures the infrared absorption coefficient of the semiconductor substrate W such that a signal representative of the thus measured value is outputted to the temperature rise/fall characteristic determination means 22, and thereafter, said semiconductor substrate W is fed into the reactor 11 where the same is supported by the hoisting pins 15, which descends to place the semiconductor substrate W on the susceptor 13.

On the other hand, the temperature rise/fall characteristic determining means 22 is inputted with a signal representative of the values measured by said infrared absorption meter 21 such that the rate of temperature rise and the range of in-plane distribution of the semiconductor substrate W in a predetermined period of time are computed on the basis of presence or absence of detected infrared rays and the size of the infrared absorption coefficient to determine a value of the temperature rise/fall characteristic thereof and a signal representative of the determined value is inputted into the heater output control means 23.

And then, a temperature control program adaptable for the temperature rise/fall characteristic inputted from the temperature rise/fall characteristic determining means 22 into said heater output means 23 is automatically selected at said heater output means 23 out of the temperature control programs stored in advance such that the output of the heater 12 is subjected to the temperature rise/fall control on the basis of the thus selected temperature control program by inputting and controlling the signal representative of the value measured by infrared thermometer.

In the afore-mentioned embodiment, the explanation was given in the case of said the infrared absorption coefficient meter 21 being provided along said transport chamber 19 in the proximity of the reactor 11 but such meter 21 may be provided anywhere. Otherwise, the infrared thermometers 16 and the heater 12 provided within the reactor 11 may act as an infrared absorption coefficient meter.

Figure 8:
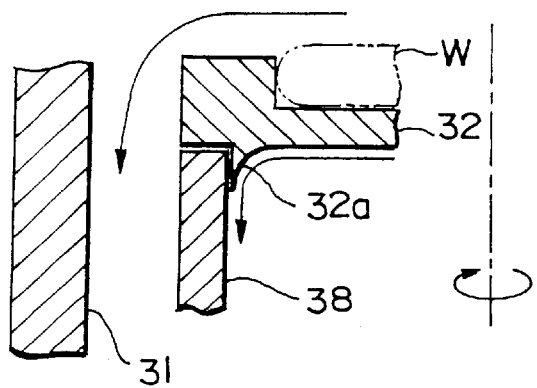
FIG. 8 is a fragmentary cross section showing the internal structure of one example of the reactor in the gas phase thin film growth apparatus in which a susceptor according to the present invention.
Figure 11:
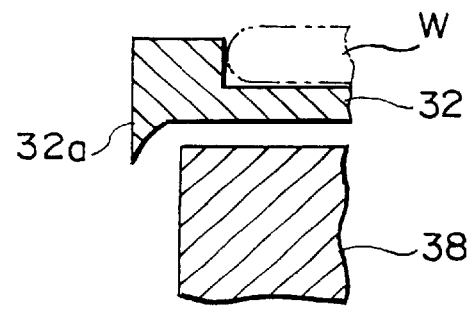
FIG. 11 is a fragmentary cross section showing a still further example of the susceptor according to the present invention.

Next, referring to FIGS. 8 and 11 showing the third embodiment of the invention, to said susceptor 32 there is added a gas flow deflector to deflect the flow of an atmosphere gas (a gas flow) from the center portion to the peripheral portion over the reverse side of the susceptor 32 into a downward direction.

For this purpose, the gas phase thin film growth apparatus according to the present invention has a structure that is similar to the conventional gas phase thin film growth apparatus except for the susceptor therein. Therefore, an explanation of the structure for the portions similar to that of the conventional gas phase thin film apparatus will be omitted.

FIG. 8 is a fragmentary cross section of the susceptor according to the invention being provided within the reactor of the gas phase thin film growth apparatus.

As shown in FIG. 8, the reactor 31 of the apparatus has a gas flow deflector 38 therewithin to surround a space extending downwardly of the peripheral portion of the susceptor 32. The reverse side of said susceptor 32 is formed with an outer wall face of an annular wall 32a acting as said deflector, said wall face being in the proximity of the upper inside face of said gas flow guide member 38.

In this connection, said susceptor 32 is rotatably provided as in the conventional apparatus while the gas flow guide member 38 being fixed to the reactor 31. Therefore, the gas deflector 32a of the susceptor 32 and the upper end of the gas flow guide member 38 is preferably provided as close to each other as possible but a mutual interference due to any possible susceptor's eccentric motion or the like must be avoided.

Further, the annular wall 32a formed in said susceptor 32 has an inside wall face in a smooth concave to deflect the gas flow while suppressing any air turbulence such that a smooth downward air deflection will be effected.

Figure 9:
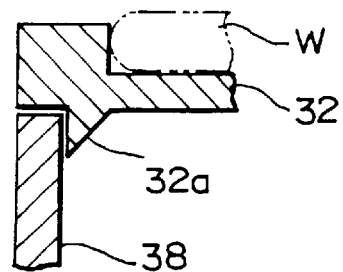
FIG. 9 is a fragmentary cross section showing another example of the susceptor according to the present invention.

As shown in FIG. 9, the inside wall face of said annular wall 32a may be in the form of a slope of 45 degrees. Otherwise, said inside wall face may be in the form of a quarter bulging arc as shown in FIG. 9. However, the modification as shown in FIG. 8 is the most preferable to suppress a gas turbulence for a smooth downward gas flow deflection.

Further, the positional relationship of the annular wall 32a and the gas flow guide member 38 in FIG. 11 is opposite to that shown in FIG. 8; that is, the annular wall 32a may be positioned outside the gas flow guide member 38. In this arrangement, an atmosphere gas will flow through the gap between the reverse side of the susceptor 32 and the top end face of the gas flow guide member 38, when said annular wall 32a assures a smooth downward gas flow deflection.

In this embodiment, it is shown that the annular wall 32a is provided integrally with said susceptor 32. However this arrangement is not limitative but a separately formed susceptor 32 and an annular wall 32a may be assembled into one member.

In view of production easiness, anti heat impact strength and endurance, an integral structure of the same material as the body of the susceptor is more preferable.

Figure 10:
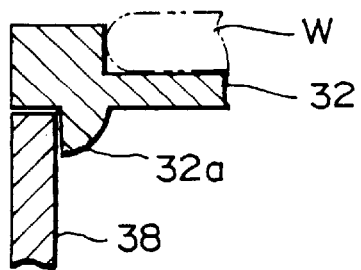
FIG. 10 is a fragmentary cross section showing a further example of the susceptor according to the present invention.

Further, in the above embodiments, it is shown that the annular wall 32a is provided inside or outside the gas flow guide member 38 but it is more preferable that the annular wall 32a is provided inside the gas flow guide 38 as shown in FIGS. 8 through 10, the surface of the annular wall (or the gas flow deflector) 32a of the susceptor 32 and that of the gas flow guide member 38 being arranged closely to each other in view of a preferable effect of suppressing a possible rise of the impurities containing gas flow above the susceptor 32.

Further, the material to be used for the susceptor of the invention is not limitative but carbon, silicon carbide, quartz or the like may be used as materials of such susceptor in general.

Hereinafter, the invention will be explained in more detail with reference to examples which will follow but the invention is not limited to such examples.

EXAMPLE

Figure 12:
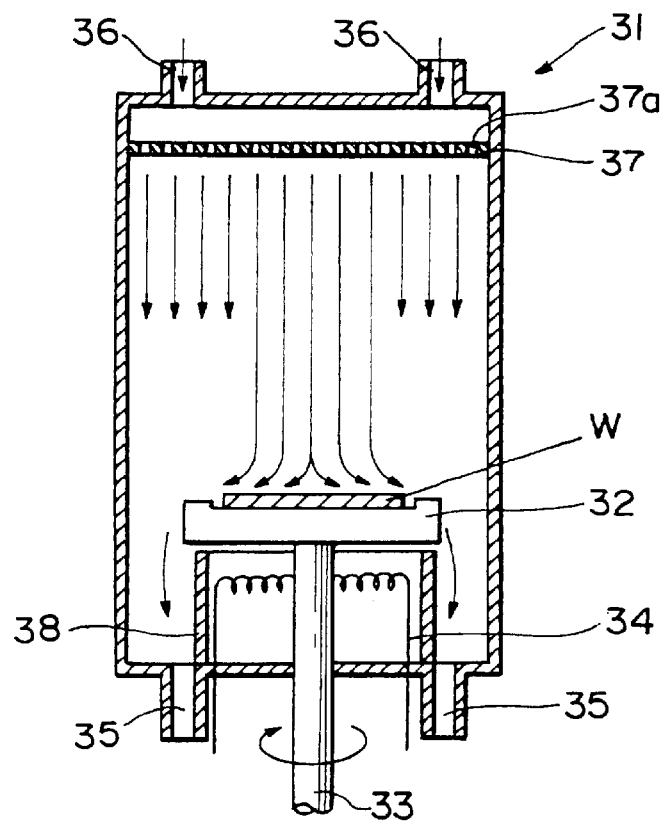
FIG. 12 is a fragmentary cross section showing a structure of a conventional gas phase thin film growth apparatus.

A susceptor 32 as shown in FIG. 8 is provided in a gas phase thin film growth apparatus shown in FIG. 12. Said susceptor 32 is formed with a recess in the upper side thereof where a silicon wafer (having a diameter of 300 mm and a thickness of 775 $\mu$m) is placed.

While $SiH_4$ gas is used as a material for forming a thin film, a hydrogen ($H_2$) gas is used as a carrier gas with the gas flow rate of $SiH_4$ being 1.5 liter/min., that of the hydrogen ($H_2$) gas being 60 liter/min. Then, a crystallized silicon thin film having a thickness of 4 $\mu$m is formed on said silicon wafer under the reaction temperature of 1,000° C., the pressure of 15 torr, and the wafer (or susceptor) revolution of 1200 rpm.

The extent of contamination with metallic impurities on the surface of the wafer formed with such crystallized silicon thin film is analyzed for appraisal by the TXR process. The result is shown in Table 1.

Comparative Example

Figure 13:
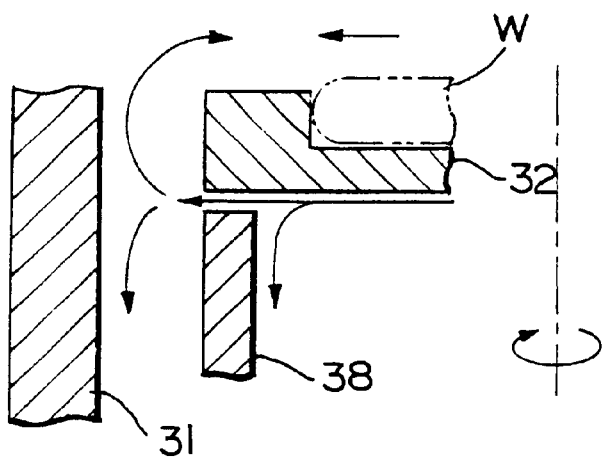
FIG. 13 is a fragmentary cross section showing an internal structure of the reactor of the conventional gas phase thin film growth apparatus.
Figure 14:
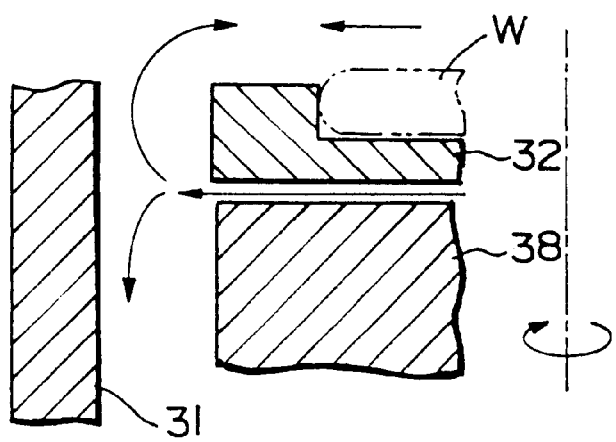
FIG. 14 is a fragmentary cross section showing an internal structure of another example of the reactor of the conventional gas phase thin film growth apparatus.

The conventional susceptor as shown in FIG. 13 is placed in the gas phase thin film growth apparatus as shown in FIG. 12 to grow a thin film on the silicon wafer under the same condition as described in Example.

Then, the volume of contaminating metal impurities on the silicon wafer formed with such crystallized silicon thin film. The results are shown in Table 1.

TABLE 1

| | contamination (atoms/c) | |
| --- | --- | --- |
| | EXAMPLE | COMPARATIVE EXAMPLE |
| Na | 1.1 | 7.1 |
| K | <0.1 | 2.4 |
| Cr | <0.1 | 1.3 |
| Fe | 0.2 | 5.8 |
| Co | <0.1 | 2.1 |
| Cu | 0.9 | 6.3 |
| Zn | <0.1 | <0.1 |

As shown in Table 1, the volumes of the contaminating metal impurities on the silicon wafer in Example are less than those in Comparative Example, showing that the susceptor according to the present invention is effective in preventing the gas phase thin film growth semiconductor substrate being contaminated with impurities.

As explained in the foregoing, the method and apparatus for controlling the rise and fall of the temperature in a semiconductor substrate according to the invention ensures that the temperature rise/fall characteristic of a semiconductor substrate is determined at the time of feed thereof into the reactor, a temperature control programs adaptable for the thus determined temperature rise/fall characteristic is determined after the substrate feed into the reactor to select the same out of one or a plurality of temperature control programs written in advance, and the temperature rise/fall control of the output of the heater is effected on the basis thereof to ensure that formation of cracks on the semiconductor substrate as observed in the prior art even though semiconductor substrates having different temperature rise/fall characteristics are fed into the reactor, thus increasing the production efficiency and reducing the production costs.

Further, the method and apparatus for controlling the rise and fall of the temperature in a semiconductor substrate according to the invention ensures that the temperature rise/fall characteristic of a semiconductor substrate is determined before or after the feed thereof into the reactor, a program adaptable for the thus determined temperature rise/fall characteristic is selected out of various temperature control programs written in advance, and the temperature rise/fall characteristic is controlled on the basis thereof, to ensure that the same effect as that of the first method and apparatus of controlling the rise and fall of the temperature in a semiconductor substrate.

The susceptor of the gas phase thin film growth apparatus according to the present invention is formed at a peripheral portion of the reverse side thereof with a gas flow deflector to deflect the atmosphere gas flow downwardly such that it is possible to prevent the semiconductor substrate from being contaminated with the metal impurities containing gas flow from the reverse side of the susceptor at the time of forming a thin film on the semiconductor.

What is claimed is:

1. A method of controlling a rise and fall of the temperature in a semiconductor substrate comprising the steps of:
   providing one or a plurality of temperature control programs in advance adaptable for a variety of semiconductor substrates having different temperature rise/fall characteristics in preparation for the case where the control of a rising and falling temperature in the semiconductor substrate is subjected to an oxidation, diffusion, or chemical vapor deposition process;
   measuring temperatures in a plurality of locations in said semiconductor substrate after the semiconductor substrate is fed into a heated reactor to obtain measured values;
   computing a rate of temperature rise and a distribution range of in-plane temperatures thereof out of said measured values to determine a temperature rise/fall characteristic thereof;
   automatically selecting a temperature control program adaptable for said determined temperature rise/fall characteristic out of said one or a plurality of temperature control programs; and
   controlling the rise and fall of said semiconductor substrate temperature on the basis of said selected temperature control program.

2. A method of controlling a rise and fall of the temperature in the semiconductor substrate as set forth in claim 1, in which the temperature of the reactor at the time of the semiconductor substrate being fed thereinto is substantially an intermediate temperature between the room temperature and the maximum heating temperature of the semiconductor.

3. A method of controlling a rise and fall of the temperature in a semiconductor substrate comprising the steps of:
   providing a variety of temperature control programs in advance adaptable for a variety of semiconductor substrates having different temperature rise/fall characteristics in preparation for the case where the control of a rising and falling temperature in a semiconductor substrate is effected as needed while the semiconductor substrate is subjected to an oxidation, diffusion, or chemical vapor deposition process;
   measuring infra-red absorption coefficients of semiconductor substrates before or after each semiconductor substrate is fed into a processing vessel to obtain a measured value;
   computing a rate of temperature rise and a distribution range of in-plane temperatures thereof to determine a temperature rise/fall characteristics thereof;
   automatically selecting a temperature control program adaptable for said determined temperature rise/fall characteristics out of said one or a plurality of temperature control programs; and
   controlling the rise and fall of said semiconductor substrate temperature on the basis of said selected temperature control programs.

4. A gas phase thin film apparatus comprising:
   a reactor;
   a susceptor rotatably placed on the upper surface of the semiconductor within the reactor;
   a gas flow deflector means jutting downwardly from the peripheral portion of the reverse side of the susceptor;
   rotary drive means for rotating said susceptor;
   heating means for heating the semiconductor substrate placed on the upper surface on the susceptor;
   means for feeding into the reactor a reaction gas containing a material gas for forming a thin film on the semiconductor substrate; and
   exhaust means for discharging a leftover reaction gas in the reactor,
   whereas said gas flow deflector means in the susceptor is adapted to cause an atmosphere gas flow flowing from the center portion to the peripheral portion over the reverse side of the susceptor at the time of rotation thereof to be deflected downwardly.

5. A gas phase thin film growth apparatus as set forth in claim 4, in which there is provided a gas flow guide member below the underside of the susceptor, said gas flow guide member having an upper end in the proximity of said gas flow deflector means of the susceptor.

6. A gas phase thin film growth apparatus as set forth in claim 4, in which said gas phase deflector means includes an annular wall jutting downwardly from the reverse peripheral portion of the susceptor.

7. A susceptor of a gas phase thin film growth apparatus, in which a semiconductor substrate is placed on the upper surface of said susceptor rotatably within the gas phase thin film growth apparatus characterized in that the reverse side of said susceptor is formed at a peripheral portion thereof with a gas flow deflector jutting from the reverse side thereof such that an atmosphere gas flow moving at the time of the rotation of the susceptor from the center thereof to the peripheral portion thereof is deflected downwardly by said gas flow deflector.

8. A susceptor of a gas phase thin film growth apparatus, as set forth in claim 7, wherein said gas flow deflector is an annular wall jutting downwardly from the peripheral portion of the reverse side of said susceptor.

9. A susceptor of a gas phase thin film growth apparatus as set forth in claim 8, wherein the inside wall face of said annular wall is in concave or slope form.

10. A susceptor of a gas phase thin film growth apparatus, as set forth in claim 8, wherein said annular wall is integrally formed with said susceptor.

11. An apparatus for controlling the rise and fall of the temperature in a semiconductor substrate comprising:
   a reactor in which a semiconductor substrate is subjected to an oxidation, diffusion, or a chemical vapor deposition process;
   a disc-shaped horizontal heated provided at a lower portion of said reactor;
   a susceptor rotatably provided above said heater to horizontally hold said semiconductor substrate thereon;
   at least three hoisting pins to horizontally support said semiconductor substrate when fed into said reactor and place said semiconductor substrate on said susceptor;

a plurality of thermometers provided at the upper portion of the reactor to measure the temperature of the semiconductor substrate;

means for determining temperature rise/fall characteristics by inputting values measured by said thermometers to compute the rate of temperature rise and the range of in-plane temperature distribution; and a heater output control means for controlling an output of said disc-shaped horizontal heater by storing a variety of temperature control programs provided in advance in correspondence with a variety of semiconductor substrates having different temperature rise/fall characteristics, selecting a temperature control program adaptable for the temperature rise/fall characteristic determined by said means for determining the temperature rise/fall characteristics out of said variety of temperature control programs provided in advance, and inputting the values measured by the substrate thermometer based on the selected temperature control program.

12. An apparatus for controlling the rise and fall of the temperature in a semiconductor substrate as set forth in claim 11, wherein said thermometer is an infrared radiation thermometer.

13. An apparatus for controlling the rise and fall of the temperature in a semiconductor substrate at the time of oxidation, diffusion, or a chemical vapor deposition (CVD) process thereof comprising:

a reactor in which a semiconductor substrate is subjected to an oxidation, diffusion, or a chemical vapor deposition process;

a disc-shaped horizontal heater provided at a lower portion of said reactor;

a susceptor rotatably provided above said heater to horizontally hold said semiconductor substrate thereon;

at least three hoisting pins adapted to ascend, horizontally support said semiconductor substrate fed into said reactor, descend and land said semiconductor substrate on the susceptor;

a plurality of thermometers provided at the upper portion of the reactor to measure the temperature of the semiconductor substrate;

a cassette provided beside the reactor and loaded with a number of semiconductor substrates in a plurality of layers;

a transport unit to transfer said semiconductor substrates from said cassette to the upper portion of said reactor;

infrared absorption coefficient meters provided along the transport unit of said semiconductor substrates from a discharge position of the semiconductor substrates from the cassette to a loading position thereof until said semiconductor substrates are placed on the hoisting pins;

means for determining a temperature rise/fall characteristic by inputting values measured by said infrared absorption coefficient meter to compute the rate of temperature rise and the range of in-plane temperature distribution; and a heater output control means for controlling an output of said disc-shaped horizontal heater by storing a variety of temperature control programs provided in advance in correspondence with a variety of semiconductor substrates having different temperature rise/fall characteristics, selecting a temperature control program adaptable for the temperature rise/fall characteristic determined by said means for determining temperature rise/fall characteristic out of said variety of temperature control programs provided in advance, and inputting the measured values for the substrate thermometers based on the selected temperature control program.

14. A gas phase thin film apparatus comprising:

a reactor;

a susceptor rotatably placed on the upper surface of the semiconductor within the reactor;

a gas flow deflector jutting downwardly from the peripheral portion of the reverse side of the susceptor;

a rotary drive and motor for rotating said susceptor;

a heater for heating the semiconductor substrate placed on the upper surface of the susceptor;

a gas guiding plate for feeding into the reactor a reaction gas containing a material gas for forming a thin film on the semiconductor substrate; and exhaust gas pipes for discharging a leftover reaction gas in the reactor, whereas said gas flow deflector in the susceptor is adapted to cause an atmosphere gas flow flowing from the center portion to the peripheral portion over the reverse side of the susceptor at the time of rotation thereof to be deflected downwardly.

* * * * *